US011348916B2

(12) United States Patent
Lilak et al.

(10) Patent No.: US 11,348,916 B2
(45) Date of Patent: May 31, 2022

(54) LEAVE-BEHIND PROTECTIVE LAYER HAVING SECONDARY PURPOSE

(71) Applicant: INTEL CORPORATION, Santa Clara, CA (US)

(72) Inventors: Aaron D. Lilak, Beaverton, OR (US); Anh Phan, Beaverton, OR (US); Ehren Mannebach, Beaverton, OR (US); Cheng-Ying Huang, Hillsboro, OR (US); Stephanie A. Bojarski, Beaverton, OR (US); Gilbert Dewey, Beaverton, OR (US); Orb Acton, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 824 days.

(21) Appl. No.: 16/024,076

(22) Filed: Jun. 29, 2018

(65) Prior Publication Data

US 2020/0006330 A1    Jan. 2, 2020

(51) Int. Cl.
*H01L 27/088* (2006.01)
*H01L 29/423* (2006.01)
(Continued)

(52) U.S. Cl.
CPC .... *H01L 27/0886* (2013.01); *H01L 21/76283* (2013.01); *H01L 23/528* (2013.01);
(Continued)

(58) Field of Classification Search
CPC ............ H01L 27/0886; H01L 27/0688; H01L 27/0924; H01L 21/76283; H01L 21/76232;
(Continued)

(56) References Cited

U.S. PATENT DOCUMENTS 10,998,444 B2 * 5/2021 Reznicek ............ H01L 29/7827
2014/0027860 A1   1/2014 Glass et al.
(Continued)

FOREIGN PATENT DOCUMENTS

WO    2016204755 A1    12/2016
WO    2017095409 A1    6/2017

*Primary Examiner* — Dao H Nguyen
(74) *Attorney, Agent, or Firm* — Schwabe, Williamson & Wyatt, P.C.

(57) ABSTRACT

Stacked transistor structures having a conductive interconnect between upper and lower transistors. In an embodiment, the interconnect is formed by first provisioning a protective layer over an area to be protected (gate dielectric or other sensitive material) of upper transistor, and then etching material adjacent and below the protected area to expose an underlying contact point of lower transistor. A metal is deposited into the void created by the etch to provide the interconnect. The protective layer is resistant to the etch process and is preserved in the structure, and in some cases may be utilized as a work-function metal. In an embodiment, the protective layer is formed by deposition of reactive semiconductor and metal material layers which are subsequently transformed into a work function metal or work function metal-containing compound. A remnant of unreacted reactive semiconductor material may be left in structure and collinear with protective layer.

13 Claims, 12 Drawing Sheets

(51) Int. Cl.
   *H01L 29/08*   (2006.01)
   *H01L 21/762*  (2006.01)
   *H01L 23/528*  (2006.01)
   *H01L 29/78*   (2006.01)
   *H01L 29/06*   (2006.01)

(52) U.S. Cl.
   CPC ...... *H01L 29/0649* (2013.01); *H01L 29/0669* (2013.01); *H01L 29/0847* (2013.01); *H01L 29/4232* (2013.01); *H01L 29/785* (2013.01)

(58) Field of Classification Search
   CPC ......... H01L 21/76898; H01L 21/28088; H01L 23/528; H01L 29/0649; H01L 29/0669; H01L 29/0847; H01L 29/4232; H01L 29/785
   USPC ................................ 257/401, 368, 369, 288
   See application file for complete search history.

(56) References Cited

U.S. PATENT DOCUMENTS

| | | |
|---|---|---|
| 2016/0260802 A1 | 9/2016 | Glass et al. |
| 2017/0229310 A1* | 8/2017 | Fung ................... H01L 29/0653 |
| 2020/0135747 A1* | 4/2020 | Reznicek .......... H01L 27/11206 |
| 2020/0235134 A1* | 7/2020 | Lilak ............... H01L 21/823431 |

* cited by examiner

LEAVE-BEHIND PROTECTIVE LAYER HAVING SECONDARY PURPOSE

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the Z-dimension (build upwards rather than laterally outwards in the X and Y dimensions). Some such 3D integrated circuits are monolithic in nature, in that they are formed utilizing a technique known as layer transfer. Such layer transfer may include, for instance, bond and hydrogen-based or hydrogen/helium based cleave techniques. Another means of performing layer transfer is to bond (such as with an oxide) two distinct wafers (sometimes referred to as host and donor wafers or substrates) and then perform a chemical-mechanical polish (CMP) operation to remove bulk of the bonded wafer leaving only a relatively thin region on the host wafer. This bond and polish operation may also utilize an etchstop embedded within the donor wafer. In any such cases, such 3D integration schemes give rise to a number of non-trivial issues, particularly with respect to forming interconnects between an upper transistor and a lower transistor.

Figure 1:
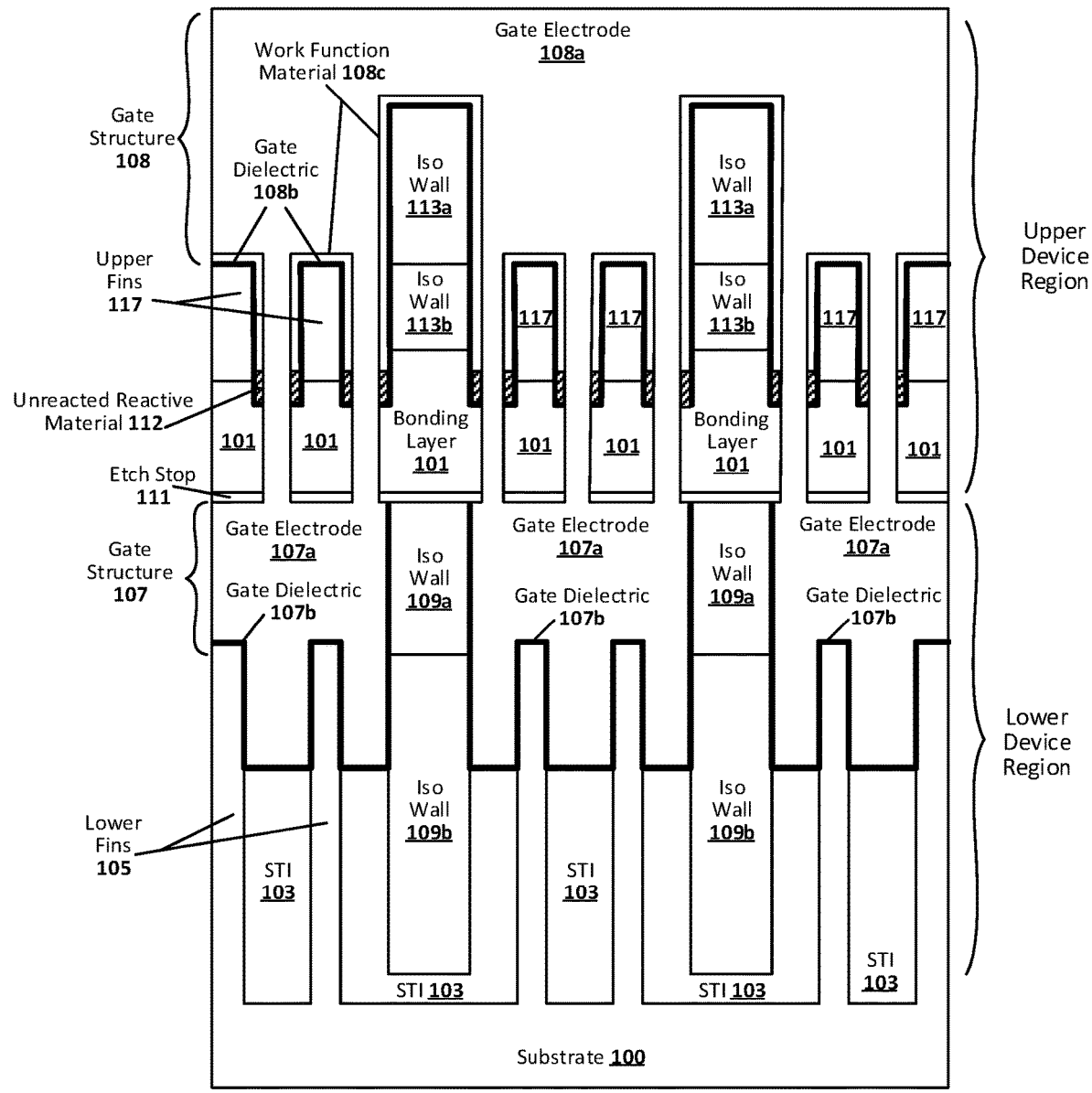
FIG. 1 illustrates a cross-section view of an integrated circuit including an interconnect structure for electrically connecting gates of stacked transistors, in accordance with an embodiment of the present disclosure. The cross-section is taken parallel to the gate and through the gated channel regions.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Stacked transistor structures are disclosed having a conductive interconnect between upper and lower transistors. In an embodiment, the interconnect is formed by first provisioning a protective layer over an area to be protected (such as a high-k gate dielectric, or a source/drain material) of the upper transistor, and then performing a vertical etch of material adjacent and below the protected area to expose an underlying contact point of the lower transistor. Note the etch need not be anisotropic or otherwise perfectly vertical; rather the etch may be largely anisotropic with an isotropic component, or an otherwise suitable high-aspect ratio etch. As will be appreciated, this applies to any usage of vertical etch herein. In any case, a metal (or other conductor) is deposited into the void created by the etch to provide the conductive interconnect. The protective layer is resistant to the vertical etch process and is preserved in totality or otherwise to a substantial degree in the final structure, and in some cases may be utilized as a work function metal. In an embodiment, the protective layer is formed by deposition of reactive semiconductor and metal material layers which are subsequently transformed into a work function metal or work function metal-containing compound. In some such embodiments, a remnant of unreacted reactive semiconductor material remains in the final structure and is collinear with the protective layer. The techniques may be applied to any stacked transistor architectures, including those configured with planar and/or non-planar transistors (e.g., FinFET, nanowire, and nanoribbon transistors).

General Overview

As previously explained, connecting upper and lower source/drain or gate regions of a stacked transistor structure can give rise to a number of non-trivial issues. For instance, one possible solution includes routing contact metal around a channel region or a source/drain region with a wrap-around construction, while another possible solution includes routing contact metal within the interstitial region between the feature to be connected (gate electrode or source/drain contact structure) and adjacent isolation material. Any such approaches generally necessitate a relatively large amount of area to be dedicated to the interconnect structure and therefore expand the footprint of the die. In addition, there may be a further constraint pertaining to the vertical interconnect of the gate region of a device, in that the channel of the transistor must be preserved. For instance, if the vertical etch is performed after high-k gate dielectric material is deposited, the integrity of that material must not be deleteriously impacted. For this reason, a protective layer can be provisioned to protect the gate dielectric, and then removed. For instance, in one possible process, a protective layer deposited over the gate dielectric could either be eroded by the vertical etch process itself and/or otherwise removed following the completion of the vertical etch. Such a process, however, runs a significant risk of deleteriously impacting the underlying gate dielectric material being protected (e.g., pinholes, thickness variations, or other undesired affects). A similar issue may arise with respect to sensitive materials in other locations of a given transistor structure. Another possible process relies upon low energy ion implantation into specific regions of the protective layer, so as to provide strong etch selectivity between doped and undoped regions (i.e., doped material is harder to etch than undoped material). However, it is very difficult to confine an ion implant to a given region of a protective layer, especially for highly scaled devices and relatively narrow protective regions (necessitated by the need to have sufficient space outside of the protected region to introduce a conductor). For instance, some quantity of impurity may be unintentionally introduced into the channel region of the device thereby causing performance issues (e.g., threshold voltage shift, mobility degradation).

Thus, stacked transistor structures are disclosed herein having a conductive interconnect between an upper transistor and a lower transistor. The disclosed techniques are particularly useful with respect to forming a conductive interconnect between an upper transistor gate structure and a lower transistor gate structure, or between an upper source/drain contact structure and a lower source/drain contact structure, or some other interconnect between an upper transistor and a lower transistor integrated in a vertically stacked configuration. In an embodiment, an interconnect is formed by first provisioning a protective layer over an area of the upper transistor to be protected, and then performing a vertical etch to remove material adjacent and below the protected area to expose an underlying contact point of the lower transistor. A metal or other conductor is deposited into the void created by the etch to provide the interconnect. The protective layer is resistant to the vertical etch process so as to protect the underlying material (e.g., gate dielectric or source/drain material). In addition, the protective layer is preserved in the final structure rather than being removed after the vertical etch process. Thus, the underlying protected material is not subjected to a removal process.

In some example embodiments, the protective layer is multifunctional or multipurpose. For instance, in some such embodiments the protective layer not only provides protection to a given area during the vertical etch processing that forms the interconnect pathway, but also serves as a work function metal in the final integrated circuit device. For instance, in some such example embodiments, the protective layer is formed on the gate dielectric over the channel region of the upper transistor and provides a work function component to the gate electrode on that gate dielectric. As will be appreciated, a work function metal in the gate electrode structure of a transistor beneficially can be used to tune the threshold voltage of that transistor. In still other embodiments, the protective layer is formed on a material of the source/drain region, and is similarly utilized as a work function metal.

The protective layer can be formed, for example, by deposition of reactive semiconductor and metal material layers which are subsequently transformed (by application of heat) into a work function metal or work function metal-containing compound. The reactive semiconductor material can be, for example, silicon or germanium or tin or alloys thereof, although other such reactive semiconductor materials will be appreciated. According to one such embodiment, the lower portion of this reactive semiconductor material is then masked-off with a non-reactive material via a fill and recess process. The masked-off portion of reactive semiconductor material will not be converted to work function metal, as will be explained in turn. The non-reactive mask can be any number of hardmask materials, such as silicon nitride or silicon carbide or silicon oxynitride or a photoresist material. A metal reactant is then deposited upon the structure over the reactive semiconductor material and mask, such as titanium, nickel, platinum, cobalt, aluminum, erbium, or an alloy thereof. The structure is then thermally annealed to react the metal reactant with the exposed reactive semiconductor material to form a work function metal. So, for instance, the reactive metal specie can be titanium and the reactive semiconductor can be silicon, and the resultant of the thermal reaction is a titanium silicide ($Ti_xSi_y$, where x and y are the compositional fraction of each component). Another example case is where the reactive metal specie is nickel or platinum and the reactive semiconductor is germanium, and the resultant of the thermal reaction is a nickel germanide ($Ni_xGe_y$) or platinum germanide ($Pt_xGe_y$). In a more general sense, an embodiment of the present disclosure includes a vertically stacked integrated circuit transistor structure that includes a layer that provides protection to an underlying material during an etch process used in forming the structure, and further provides a tunable parameter to improve or otherwise modify performance of the protected device.

In any such cases, with the protective layer in place, a vertical etch can then be performed to selectively remove the remaining mask material as well as any underlying layers of the structure (e.g., gate dielectric layer, bonding layer, etch stop layer), so as to expose the underlying metal structure (e.g., gate electrode structure, source/drain contact structure) to which interconnection is desired. The protective layer remains intact during this etch and afterwards.

Note that, in some embodiments, a remnant of unreacted reactive semiconductor material may be left in final structure and self-aligned or otherwise collinear with the protective layer. This remnant is unreacted, because it is covered by the mask during deposition of the reactive metal and the subsequent thermal conversion process, so it is not allowed to react with the reactive metal. In addition, because it is directly under a reacted portion that ultimately becomes the protective layer, the unreacted portion is self-aligned to the protective layer, particularly when the vertical etch to form the void for the interconnect is highly or substantially vertical (anisotropic or anisotropic with a relatively minor isotropic component), according to some embodiments. Other structural features may include, for instance, a remaining portion of bonding oxide and etch stop materials underneath the protected area, that are also collinear or self-aligned with the protective layer, according to some example embodiments.

The protected area may vary from one embodiment to the next, and the interconnect formed may connect various points in a given stacked transistor configuration. For instance, the protected area can be a high-k gate dielectric over the channel region of the upper transistor, and the interconnect connects the upper transistor gate structure to the lower transistor gate structure. Alternatively, the protected area can be a material in the source/drain region of the upper transistor, and the interconnect connects the upper transistor source/drain contact structure to the lower transistor source/drain contact structure. In still other cases, the interconnect connects an upper transistor gate structure to a lower transistor source/drain contact structure, or an upper transistor source/drain contact structure to a lower transistor gate structure. In any such cases, note that the gated channel region can be planar (e.g., very wide fins or spans of semiconductor material that are gated only in a horizontal plane) or non-planar (e.g., fin suitable for forming FinFETs or multilayer fin structure suitable for forming nanowires or nanoribbons). Numerous configuration and variations will be appreciated in light of this disclosure.

In any such cases, the resulting stacked transistor structure can be configured with top and bottom planar and/or non-planar transistor structures, such as FinFETs (tri-gate, double-gate) and gate-all-around transistor devices (nanowires, nanoribbons). In complementary metal oxide semiconductor (CMOS) configurations, one of the top or bottom can be PMOS and the other of the top or bottom can be NMOS. In other embodiments, the top and bottom transistors may be the same type (both PMOS or NMOS), depending on the integrated circuit being fabricated. In some specific example cases, the upper transistors are PMOS transistors having group IV semiconductor materials, and the lower transistors are NMOS transistors having group III-V semiconductor materials.

Gate-first and gate-last processes, as well as etch-and-replace epitaxial source and drain processes, may be used, as will be appreciated. The top and bottom gate structures may be the same in some embodiments, and different in other embodiments such as in cases that utilize a CMOS configuration where, for example, the top gate structure has a p-type work function metal and the bottom gate structure has an n-type work function metal, or some other difference. The bottom transistor devices can be formed separately, and then that resulting structure can be bonded to another wafer or substrate upon which the upper transistor devices reside. An etch stop layer to which the bonding layer is bonded can be used to protect the bottom transistor devices. So, and according to some embodiments, the gate structure as well as the source and drain regions and corresponding contact structures associated with the top channel region can be processed after the gate structure, source/drain regions and corresponding contact structures associated with the bottom channel region are formed, and after the wafer/substrate bonding process is carried out.

Materials that are compositionally different or compositionally distinct as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture and Methodology

FIG. 1 illustrates a cross-section view of an integrated circuit including an interconnect structure for electrically connecting gates of stacked transistors, in accordance with an embodiment of the present disclosure. The cross-section is taken parallel to the gate and through the gated channel regions. As can be seen, this example configuration includes a monolithically stacked transistor architecture that includes upper and lower device regions bonded to one another by way of a bonding layer. Note, however, that any number of layer transfer or other forming methods (including hydrogen-based or hydrogen/helium based cleave techniques) can be utilized to provide the monolithically stacked transistor architecture, and the techniques provided herein can be readily integrated, for instance, into the gate structure processing of the upper device region, as will be appreciated in light of this disclosure. As will be further appreciated, the example embodiment is shown as including fins, but other embodiments may be configured with nanowires or nanoribbons, or even a planar channel region.

The lower device region of this particular example embodiment includes a substrate 100 having a number of fins 105 extending upward therefrom. The fins 105 are grouped in pairs in this example case, but in other embodiments may be single fins or some other grouping of fins. In still other embodiments, the fins 105 may be configured as multilayer stacks suitable for forming nanowires or nanoribbons, or with replacement fins that are not native to substrate 100. In any such cases, the individual fins 105 are isolated from one another by shallow trench isolation (STI) 103. In addition to the STI 103, the fin pairs (or other fin groups) are further isolated from one another by isolation walls 109, which generally include portions 109a and 109b. In addition to providing isolation, isolation walls 109 provide etch selectivity with respect to STI 103, as will be discussed in turn. As can further be seen, a gate structure 107 is provided around the channel region of each fin, in a tri-gate configuration. In other embodiments, the gate structure 107 may wrap around the channel region, in a gate-all-around configuration, for nanowire or nanoribbon channels. In still other embodiments, the gate structure 107 may be a planer gate structure, where the gated channel region is effectively in one plane. In any such cases, the gate structure 107 generally includes a gate electrode 107a and a gate dielectric 107b. Note the gate electrode 107a electrically connects multiple neighboring channel regions, in this example embodiment. In other embodiments, each fin may have its own gate electrode, rather than a shared gate electrode. As will be further appreciated, the gate structure 107 may further include work function material (e.g., between gate electrode 107a and gate dielectric 107b) to tune the desired transistor performance. Although not shown in this particular cross-section, the gate structure may further include gate spacers between the gated channel region and the respective source/drain regions (not shown in this particular cross-section), as sometimes done.

As will be further appreciated, the source/drain regions may be, for example, epitaxial source/drain regions deposited on the fin or otherwise adjacent to the gated channel region, or native source/drain regions that are actually part of the fin rather. In either case, the source/drain regions can be doped accordingly, depending on the type of transistor being formed (e.g., p-type doping for PMOS transistors and n-type doping for NMOS transistors). As will be further appreciated, a source/drain contact structure (not shown in this particular cross-section) can be provided on each source/drain region (or select source/drain regions, as the case may be). Any suitable contact structure may be used, but in some example cases said contact structure includes a contact metal and a liner or diffusion barrier or functional layer provisioned as variously provided herein (similar to how work function material 108c is provisioned). Note the contact structure may electrically connect multiple neighboring source/drain regions, according to some embodiments. Likewise, if epitaxial source/drain regions are provided, note that the epitaxial deposition on neighboring fins may merge together to effectively provide a single source/drain region associated with multiple fins. In still other embodiments, one or more source/drain regions may be unmerged and contacted individually.

The upper device region generally includes similar transistor features as to the lower device region, including one or more gated channel regions between source and drain regions. The previous relevant discussion is equally applicable here. In this example configuration, the upper device region is bonded by bonding layer 101 to an etch stop layer 123 provided on the top surface of the lower device region. Fins 117 extend from the bonding layer 101. As can be further seen, gate structure 108 includes gate electrode 108a, a gate dielectric 108b, and a work function material 108c. In addition, unreacted reactive material 112 is adjacent to the gate electrode 108a, the gate dielectric 108b, and the work function material 108c, and is further collinear or otherwise self-aligned with the work function material 108c. As can be further seen in this example embodiment, gate electrode 108b provides not only the upper gate electrode, but also provides the interconnect from the upper gate structure 108 to the lower gate structure 107. As will be appreciated, note that work function material 108c may be considered part of a multilayer gate electrode 108a, but is called out separately to facilitate discussion. Likewise, unreacted reactive material 112 may be considered as part of the gate structure 108, but is called out separately to facilitate discussion. Isolation walls 113 (including portions 113a and 113b) physically separate the upper channel regions, with help from bonding layer 101.

Any number of suitable substrates can be used to implement substrate 100, including bulk substrates, semiconductors-on-insulator substrates (XOI, where X is a semiconductor material such as silicon, germanium, or germanium-enriched silicon), and multi-layered structures, including those substrates from which fins or nanowires can be formed prior to a subsequent gate patterning process. In some specific example cases, the substrate 100 is a germanium or silicon, silicon germanium (SiGe), or gallium arsenide (GaAs) bulk substrate, or a germanium or silicon or SiGe or GaAs on oxide substrate. In other specific example cases, the substrate 100 is a multilayer structure of Si and SiGe, or III-V materials such as gallium nitride (GaN) and indium gallium arsenide (InGaAs). In still other example cases, the substrate 100 is a semiconducting oxide such as nickel oxide or indium gallium zinc oxide (IGZO). Although a few examples for substrate 100 are described here, other suitable materials and configurations can be used, as will be appreciated.

The fins 105 on substrate 100 can be formed, for example, using standard mask and etch techniques to provide fins that are native to the substrate. In such cases, the fins 105 will have the same material composition as the substrate, and the example materials previously noted are equally applicable here. In other such cases, the native fins are treated as place holder fins and are etched out and replaced with epitaxial replacement fins using a so-called aspect ratio trapping (ART) based fin forming process. Example ART-based semiconductor fin forming techniques are provided, for instance, in U.S. Patent Application Publication 2014/0027860. In some such ART-based cases, the replacement fin material is provided as alternating layers of desired channel material and sacrificial/inactive material such as described in U.S. Patent Application Publication 2016/0260802. Such multilayer fins are particularly useful for forming nanowire and nanoribbon transistors (e.g., during final gate processing, prior to deposition of final gate materials). In some ART-based cases, a first set of fins or multilayer fin structures is formed with a first semiconductor material system (e.g., material having a high-germanium concentration for p-type non-planar transistor devices), and a second set of fins or multilayer fin structures is formed with a second semiconductor material system (e.g., material having a high silicon or indium concentration for n-type non-planar transistor devices). Similar discussion applies to fins 117, as will be appreciated. Note that, in one example embodiment, the substrate on which fins 117 are formed (not shown) is removed prior to the bonding process that connects the upper device region to the lower device region via bonding layer 101. Any number of fin and/or multilayer fin structure forming processes can be used in the context of the present disclosure, as will be appreciated. In a more general sense, the fins and/or fin structures 105/117 can be any materials suitable for a given stacked transistor integrated circuit application. In still other embodiments, there are no fins 105 and/or fins 117; rather, planar transistor architecture can be used instead to provide gated channel regions that are planar as opposed to the non-planar, as will be appreciated.

STI 103 can be any suitable insulator material, such as silicon dioxide, silicon nitride, silicon carbide, silicon oxynitride, a polymer, a porous version of any of these, or any combination of these (e.g., upper portion of silicon oxide and a lower portion of silicon nitride, or vice-versa). Isolation walls can be implemented, for example, with any materials that provide etch selectivity with respect to STI 103. For instance, in one such example embodiment, STI 103 is silicon dioxide, iso wall 109a is hafnium oxide or some other relatively high-k dielectric that has a lower etch rate than silicon dioxide, and iso wall 109b is silicon nitride or some other insulator having a lower etch rate than silicon dioxide as well as a lower dielectric constant than iso wall 109a. Other embodiments may have isolation wall 109 configured differently, such as to provide etch selectivity without constraint on the dielectric constant. Still other embodiments may have fewer or no isolation walls 109. In addition, note in the example embodiment shown that isolation walls 109 are provided between fin pairs. In other embodiments, there may be an isolation wall between each fin, or between every three fins, or some other configuration as will be appreciated.

In any such cases, note that the materials making up STI 103 and isolation walls 109 can be provided via atomic layer deposition (ALD) or other suitable technique such as chemical vapor deposition (CVD) or plasma-enhanced (PECVD) to provide a conformal or otherwise relatively uniform deposition, according to some embodiments. Using such a conformal deposition process, note that the isolation walls are effectively self-aligned within the corresponding body of STI 103 material. In one example embodiment, STI 103 (insulator oxide) is conformally deposited to a certain vertical thickness (e.g., 10 to 50 nm), followed by conformal deposition of iso wall 109b (etch resistant material such as insulator nitride), such that in areas between fin pairs, the iso wall 109b material closes the remaining gap between the STI 103 material and pinches off on itself. Further note that the smaller space between two fins of a given fin pair is completely filled by the STI 103 material, given the nature of the spacing (pitch). Iso wall 109a material is then conformally deposited. Any excess materials can be planarized off. Other deposition techniques such as physical vapor deposition (PVD), and molecular beam epitaxy (MBE) can be used as well, but may necessitate an alignment aspect to the forming process for isolation walls 109, as will be appreciated.

The lower gate structure 107 can be implemented with any standard processes and materials, including both gate-first and gate-last processes. For instance, in one example embodiment, the gate structure 107 is formed using a gate-last (or so-called remove metal gate or RMG process) and includes gate spacers, a gate dielectric, and a gate electrode (gate dielectric 107b and gate electrode 107a are shown in this particular cross-section). The gate structure 107 may further include a hard mask on top of the gate electrode (and any exposed gate dielectric). Any number of gate structure configurations can be used. If present, the gate spacers may be, for example, silicon nitride or silicon dioxide or a carbon-doped oxide or an oxynitride or a carbon-doped oxynitride. The gate dielectric 107b may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 107b to improve its quality when a high-k material is used. Further, the gate electrode 107a may comprise a wide range of suitable metals or metal alloys, such as aluminum, tungsten, titanium, tantalum, copper, titanium nitride, or tantalum nitride, for example. In some embodiments, the gate dielectric 107b and/or gate electrode 107a may include a multilayer structure of two or more material layers or components. For instance, in one such embodiment, the gate dielectric 107b is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode 107a structure may include a central metal plug portion (e.g., tungsten) with one or more outer work function layers and/or barrier layers (e.g., tantalum, tantalum nitride, or other work function material to optimize for p-type or n-type performance as is sometimes done), and/or a resistance reducing cap layer (e.g., copper, gold). In some embodiments, the gate dielectric 107b and/or gate electrode 107a may include grading (increasing or decreasing, as the case may be) of the concentration of one or more materials therein. In a gate-last process, the final gate structure 107 can be provided after the source/drain processing is completed. Similar discussion equally applies to gate structure 108 (including gate electrode 108a and gate dielectric 108b), although specific details with respect to work function material 108c and unreacted reactive material 112 will be provided in turn, as will be appreciated. Numerous different gate structure configurations can be used, as will be apparent in light of this disclosure.

As previously explained, the source/drain regions (not shown) may be epitaxial source/drain regions that are provided after a portion of the fin or fin structure or other substrate is isolated and etched away or otherwise removed. The source/drain material can therefore be compositionally different from the underlying fin/substrate 100 material and/or the gated channel material (the gated channel region generally refers to the part of the fin or other semiconductor body having the gate structure thereon). In other embodiments, the source/drain regions may be doped portions of the fin or fin structure or substrate, rather than epi source/drain regions. In some embodiments using an etch and epitaxial replacement process, the source/drain regions are faceted and overgrown from a trench within insulator material (e.g., STI 103), and the corresponding source or drain contact structure lands on that faceted excess portion. Alternatively, in other embodiments, the faceted excess portion of epi source/drain regions can be removed (e.g., via chemical mechanical planarization, or CMP), and the corresponding source or drain contact structure lands on that planarized portion. As will be further appreciated, in some embodiments, the removal of the original source/drain regions and replacement with epi source/drain material may result in an upper portion of the source/drain region (the overgrowth portion of the epi deposition) which is wider (e.g., by 1-10 nm) than the underlying fin structure width. Any combination of such features may result, as will be appreciated.

If present, the epi source/drain regions can be any suitable semiconductor material. For instance, PMOS source/drain regions may include, for example, group IV semiconductor materials such as silicon, germanium, SiGe, SiGe alloyed with carbon (SiGe:C). Example p-type dopants include boron, gallium, indium, and aluminum. NMOS source/drain regions may include, for example, group III-V semiconductor materials such as two or more of indium, aluminum, arsenic, phosphor, gallium, and antimony, with some example compounds including but not limited to indium aluminum arsenide (InAlAs), indium arsenide phosphide (InAsP), indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb). In some specific such example embodiments, for instance, the channel material (fin or other body) is germanium, and the source/drain regions comprise SiGe (e.g., $Si_{1-x}Ge_x$ where $0.20 \leq x \leq 0.99$; or $Si_xGe_y:C_z$ where $8 \leq x \leq 16$; $80 \leq y \leq 90$; $1 \leq z \leq 4$; $x+y+z=100$). In another embodiment, the channel material could be, for instance, $In_xGa_{1-x}As$ $0.51 \leq x \leq 0.55$; $0.10 \leq y \leq 1.00$ or InAs, and the source/drain regions comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). Example N-type dopants include phosphorus, arsenic, and antimony. In still other embodiments, the transistors in the lower device region include NMOS and PMOS transistors both implemented with group IV materials, or just NMOS transistors implemented with group IV materials, or just PMOS transistors implemented with group IV materials. In a more general sense, source/drain regions can be any semiconductor material suitable for a given application.

In some cases, the epi source/drain regions (if present) may include a multilayer structure, such as a germanium cap on a SiGe body, or a germanium body and a carbon-containing SiGe spacer between the corresponding channel region and that germanium body. In any such cases, a portion of the epi source/drain regions may have a component that is graded in concentration, such as a graded germanium concentration to facilitate lattice matching, or a graded dopant concentration to facilitate low contact resistance. Any number of source/drain configurations can be used as will be appreciated in light of this disclosure, and the present disclosure is not intended to be limited to any particular such configurations.

The source/drain contact structures (not shown in this particular cross-section) can have any number of standard configurations. In one example embodiment, the contact structures include a contact metal and a liner. The liner (sometimes called a barrier layer) can be, for example, tantalum or tantalum nitride. In still other embodiments, the liner may be a work function tuning layer or other functional layer that is provisioned using a reactive semiconductor material layer and a reactive metal material layer (as will be discussed in the context of work function material 108c). The contact metal can be any suitable plug/core material, such as tungsten, aluminum, ruthenium, cobalt, copper, or alloys thereof. In some cases, note the liner can be tuned to a given polarity, much like the work function material 108c, and as will be appreciated in light of this disclosure. For instance, according to some such embodiments, the liner can be titanium silicide for NMOS source/drain contact structures, or nickel or platinum germanide for PMOS source/drain contact structures. Other embodiments may be configured differently. In a more general sense, the contact structures can be optimized p-type and n-type contact structures similar to p-type and n-type gate electrode structures as variously described herein, and/or include resistance reducing materials (e.g., nickel, platinum, nickel platinum, cobalt, titanium, germanium, nickel, gold, or alloys thereof such as germanium-gold alloy, or a multilayer structure of titanium and titanium nitride). Any number of suitable source/drain contact structures can be used in accordance with an embodiment of the present disclosure, as will be appreciated, and the present disclosure is not intended to be limited to any particular such contact structure configurations.

An etch stop layer 123 is provided on the top of the lower device region, which can be, for example, silicon nitride or silicon carbide or some other suitable etch stop material. In some cases, the etch stop 123 provides etch selectivity with respect to the bonding layer 101. Note that the etch stop 123 may also act as a passivation layer to protect the lower device region during the layer transfer process. Other example embodiments may not use an etch stop, which may be acceptable in some cases. Isolation wall 113, including portions 113a and 113b, can be provisioned in a similar manner as isolation wall 109, wherein previously relevant discussion with respect to portions 109a-b equally apply to portions 113a-b.

As will be appreciated, the upper device region shown in FIG. 1 can be formed using similar processes, materials and configurations as discussed with respect to the lower device region, and that relevant discussion is equally applicable here. Just as with the lower device region, the channel regions of the upper device region may be gated with any number of gate structures generally including a gate dielectric and a gate electrode, and may be planar or non-planar (e.g., fins, nanowires, nanoribbons). However, in some embodiments, that gate structure 108 includes a work function material 108c (which may be part of the gate electrode 108a, or separate therefrom) and/or an unreacted reactive material 112 provisioned, as variously provided herein. According to an embodiment, and as will be further appreciated, the gate processing for the upper device layer is performed after the layer transfer process is complete and after the upper source/drain regions are formed. In the example embodiment shown, a bonding layer 101 is used to bond the upper device region to the etch stop layer 123 of the lower device region. The bonding layer can be, for example, silicon dioxide, although any number of suitable bonding layer materials can be used, such as those that provide etch selectivity with respect to the etch stop, if such etch selectivity is desired, and as will be appreciated.

Once the upper and lower device regions are bonded or otherwise integrated into a monolithic stacked structure, the upper gate structure can be performed. If the upper source/drain regions are not yet provisioned, then standard source/drain processing can be carried out prior to any final gate processing, if a gate-last process is desired, according to some embodiments. In some such embodiments, the gate-last processing includes provisioning of a protective layer that protects the gate dielectric 108b and subsequently operates as a work function material 108c, as shown in FIG. 1 and as will be further explained with reference to FIGS. 2a-2j. In other embodiments, such a protective layer can be provisioned during the source/drain contact structure forming process, as will be further appreciated.

In the example case shown, the gate electrode 108a spans all three depicted fin-pairs of the upper device region, and that gate electrode 108a extends downward to physically contact all three depicted lower gate structures 107 of the lower device region, thereby providing interconnection therebetween. In other embodiments, there may be, for instance, two or three distinct gate electrodes 108a (or some other arbitrary number) in the upper device region (e.g., separated by the isolation walls 113 in some cases, or not in others), and only select ones of those gate electrodes 108a extend downward to contact the underlying gate electrode 107a of the lower device region. In cases where there is no interconnect, there may be, for instance, one or more layers of insulator material between the upper gate structure 108 and the lower gate structure 107 (such as bonding layer 101 and/or etch stop 123). In still other embodiments, note that the channel regions of the upper device region may not vertically align with channel regions of the lower region, whether intentional or not (e.g., due to mis-registration). In some cases, for instance, there may be one or more gate electrodes 108a in the upper device region that extend downward to contact underlying source or drain contact structures of the lower device region. In other such cases, for example, there may be one or more source/drain contact structures in the upper device region that extend downward through the source drain region to contact an underlying gate structure of the lower device region. Numerous variations and adaptations will be apparent in light of this disclosure.

Further details as to how a protective layer is provided in the context of gate structure formation are provided with respect to FIGS. 2a-j. Further note, however, that the various other details provided herein for the upper and lower device regions are provided for example purposes only, and are not intended to limit the present disclosure. Rather, the protective layer techniques provided herein can be used with any number of vertically stacked transistor architecture configurations. For instance, and as will be appreciated, the specific configuration of the lower and upper device regions with respect to variables such as semiconductor materials used (e.g., group IV semiconductor materials, group III-V semiconductor materials, etc), type of channel regions used (e.g., fin, nanowire, nanoribbon, planar), type of substrates used (e.g., bulk, silicon-on-insulator, etc), type of fins used (e.g., native to substrate, replacement fins, multilayer fins, etc), and usage of isolation walls, will vary from one embodiment to the next, and the present disclosure is not intended to be limited to any such configurations.

FIGS. 2a-2j collectively illustrate a methodology for forming vertical contact or a so-called interconnect between monolithically stacked transistors, according to an embodiment of the present disclosure. The cross-sections are taken parallel to the gate and through the gated channel regions. The previous relevant discussion corresponding to FIG. 1 with respect to example materials and configurations and forming processes is equally applicable here.

Figure 2A:
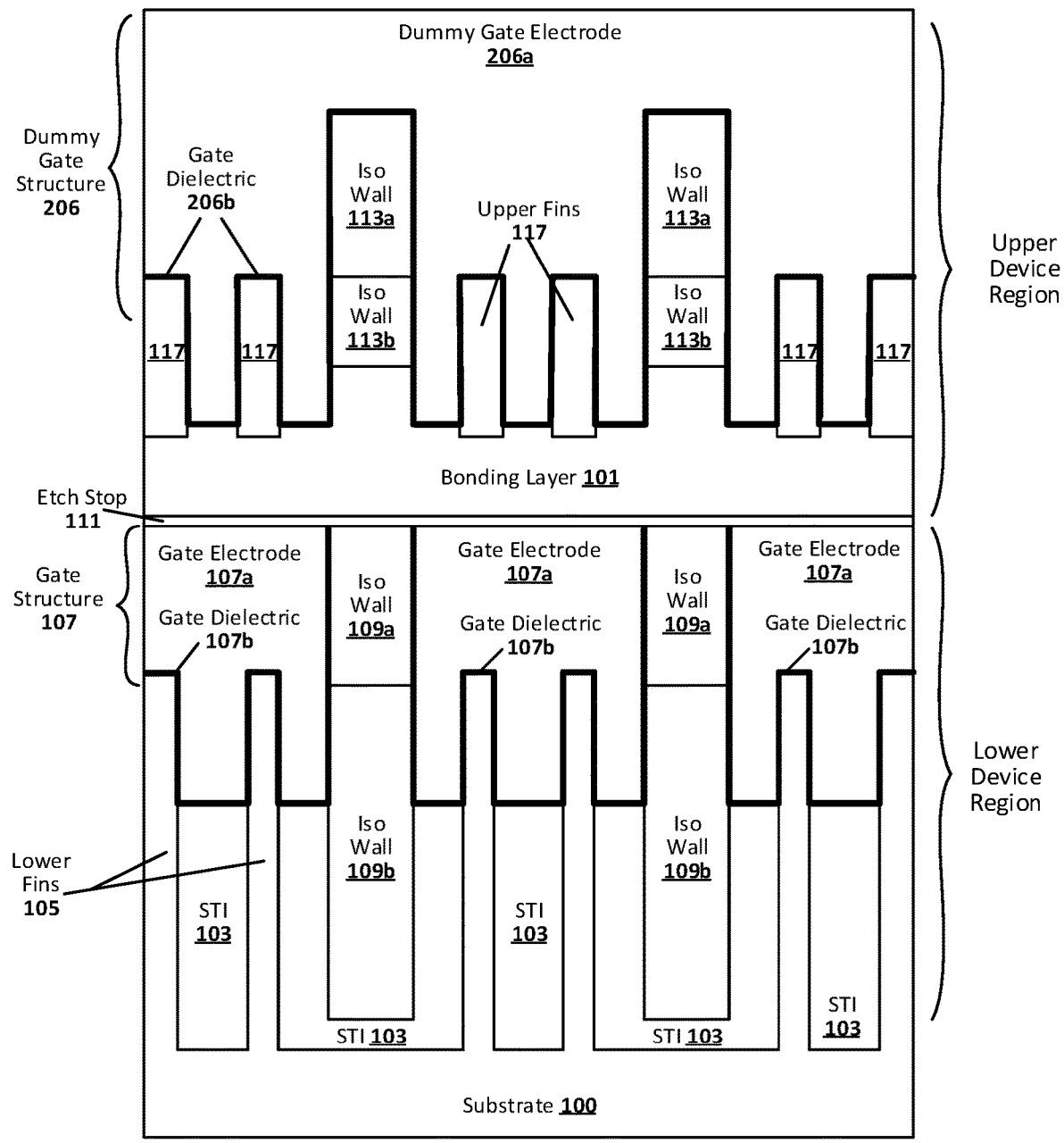
FIGS. 2a-2j collectively illustrate a methodology for forming the integrated circuit of FIG. 1, in accordance with an embodiment of the present disclosure. The cross-sections are taken parallel to the gate and through the gated channel regions.

With reference now to FIG. 2a, a partially formed integrated circuit is shown that includes upper and lower device regions in a monolithically stacked configuration. At this point in the process, the lower device region has been separately formed, and is now bonded to the upper device region by bonding layer 101. As can further be seen, a dummy gate structure 206 is currently installed, which includes dummy gate electrode 206a (e.g., polysilicon or other suitable sacrificial gate electrode material) and dummy gate dielectric 206b (e.g., silicon dioxide or other suitable sacrificial gate dielectric material). Such a dummy gate structure 206 is put in place, so that source/drain processing can take place without adversely impacting the final gate materials, which are provisioned later in the process. Such a gate process is sometimes called a gate-last process. Once the source/drain regions are in place, they are masked off and the gate-last process can commence. In FIG. 2a, assume the source/drain regions have been provisioned and masked off to isolate the dummy gate structure 206.

Figure 2B:
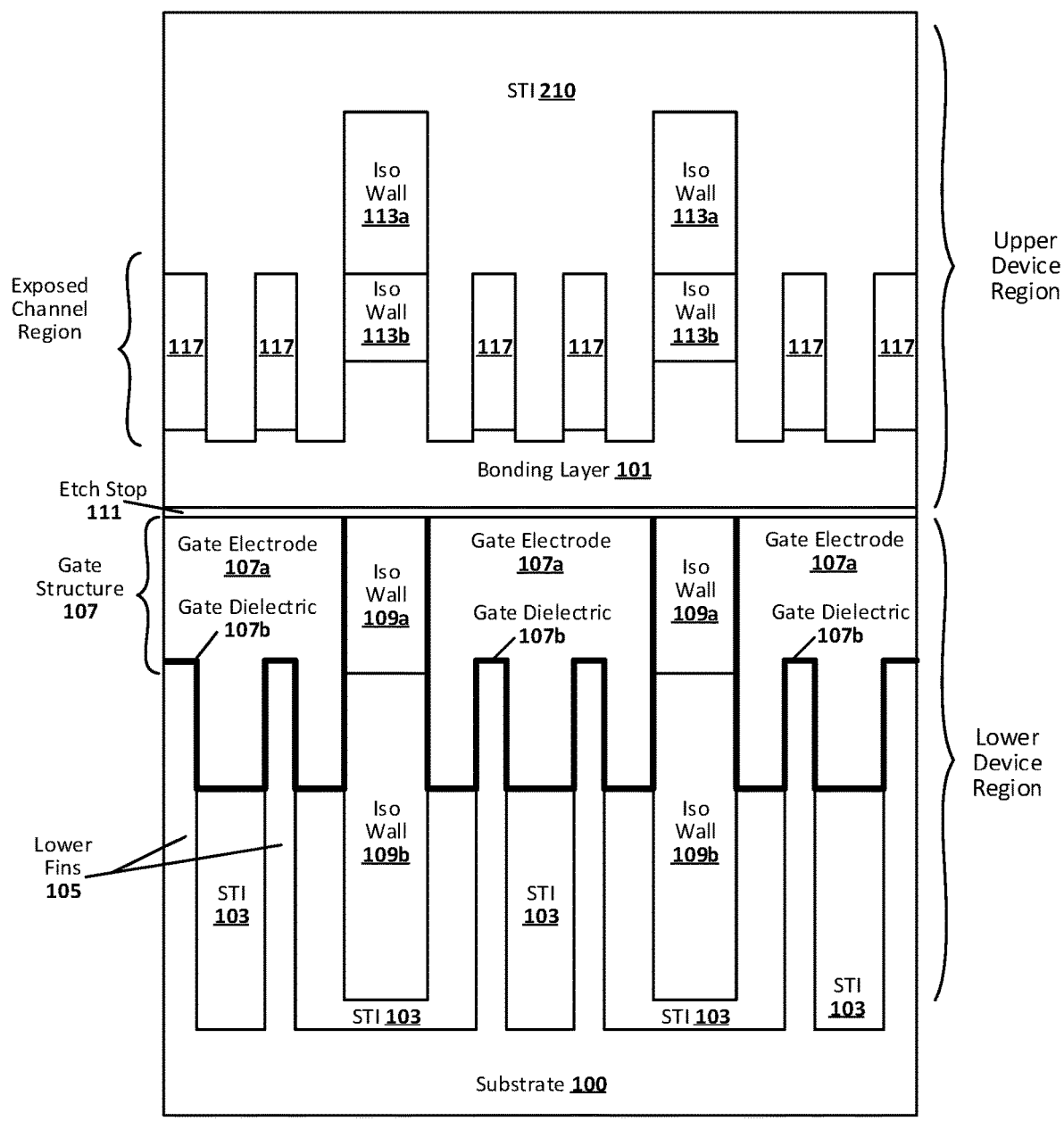

FIG. 2b shows the resulting structure after the dummy gate materials have been removed. Standard wet and/or dry etch schemes can be used, as will be appreciated. Note in the example embodiment shown, the etch scheme further causes recessing of the underlying bonding layer 101. The depth of the recess can vary, but in some embodiments is in the range of 1 nm to 10 nm. Other embodiments may not include such recessing of the bonding layer 101. Further note that, with the dummy gate materials removed, shallow trench isolation (STI) 210 can now be seen in the background of the given cross-section. This STI 210 can be, for instance, any suitable insulation material, such as silicon dioxide or porous silicon dioxide.

Figure 2C:
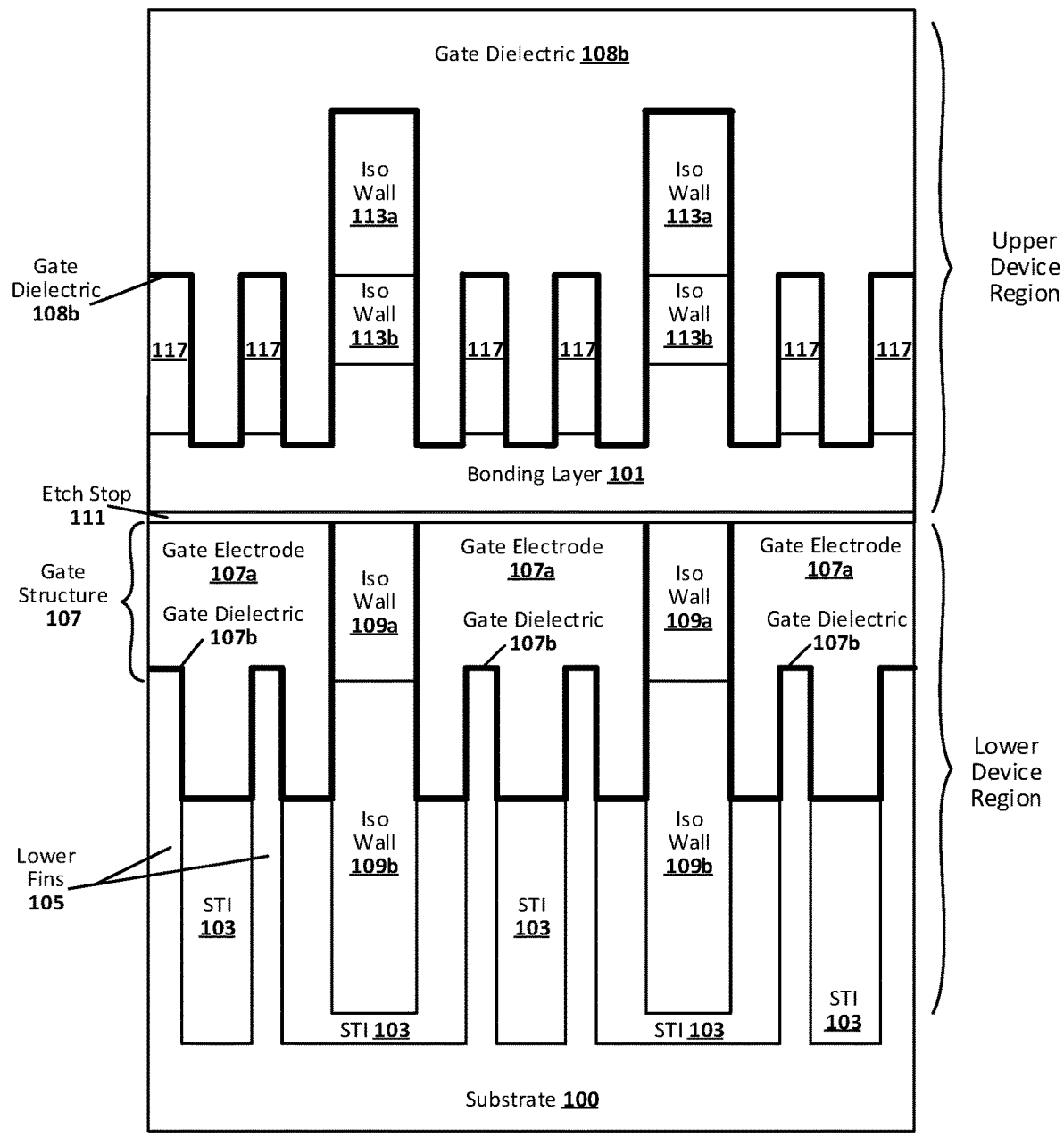

FIG. 2c shows the resulting structure after gate dielectric 108b is provisioned. The previous discussion with respect to example gate dielectric materials and structures is equally applicable here. The gate dielectric 108b can be conformally or uniformly coated, so as to cover all exposed surfaces. In other embodiments, the gate dielectric 108b can be selectively deposited, such as only on the exposed channel region (which in the example case depicted in FIG. 2c includes exposed portions of fins 117), rather than on STI 210, bonding layer 101, and isolation walls 113. In any such cases, gate dielectric 108b can have a thickness in the range of, for example, 5 angstroms to 5 nm (e.g., 1 nm to 2 nm). As previously explained, although fins 117 are shown in the upper and lower device regions, other embodiments may have multilayer fin structures (such as those sometimes used in nanowire or nanoribbon transistor configurations) or planar channel regions. In such cases, note that the gate processing may further include, prior to provisioning of the gate dielectric 108b, an etch that selectively removes sacrificial material within the multilayer fin structure so as to release the nanowires or nanoribbons. Then, gate dielectric 108b can be provisioned so as to wrap around the nanowires/nanoribbons. Further note that, in the example embodiment shown, the upper fins appear to be aligned with the lower fins. Such alignment is not necessary, as will be appreciated. For instance, in other embodiments, the upper fins, fin structures or other semiconductor bodies are not aligned with the lower fins, fin structures or other semiconductor bodies, and as such an interconnect from an upper gate structure only partially lands on the lower gate structure to provide electrical contact, which is fine according to some embodiments. Further note that fin widths and/or heights (or nanowire/nanoribbon widths and/or heights) of the lower device region can be different than fin widths and/or heights (or nanowire/nanoribbon widths and/or heights) of the upper device region (e.g., NMOS fins might be wider than PMOS fins, for instance. And the number of fins or nanowires/nanoribbons in the upper device region can be different than the number of fins or nanowires/nanoribbons in the lower device region.

Figure 2D:
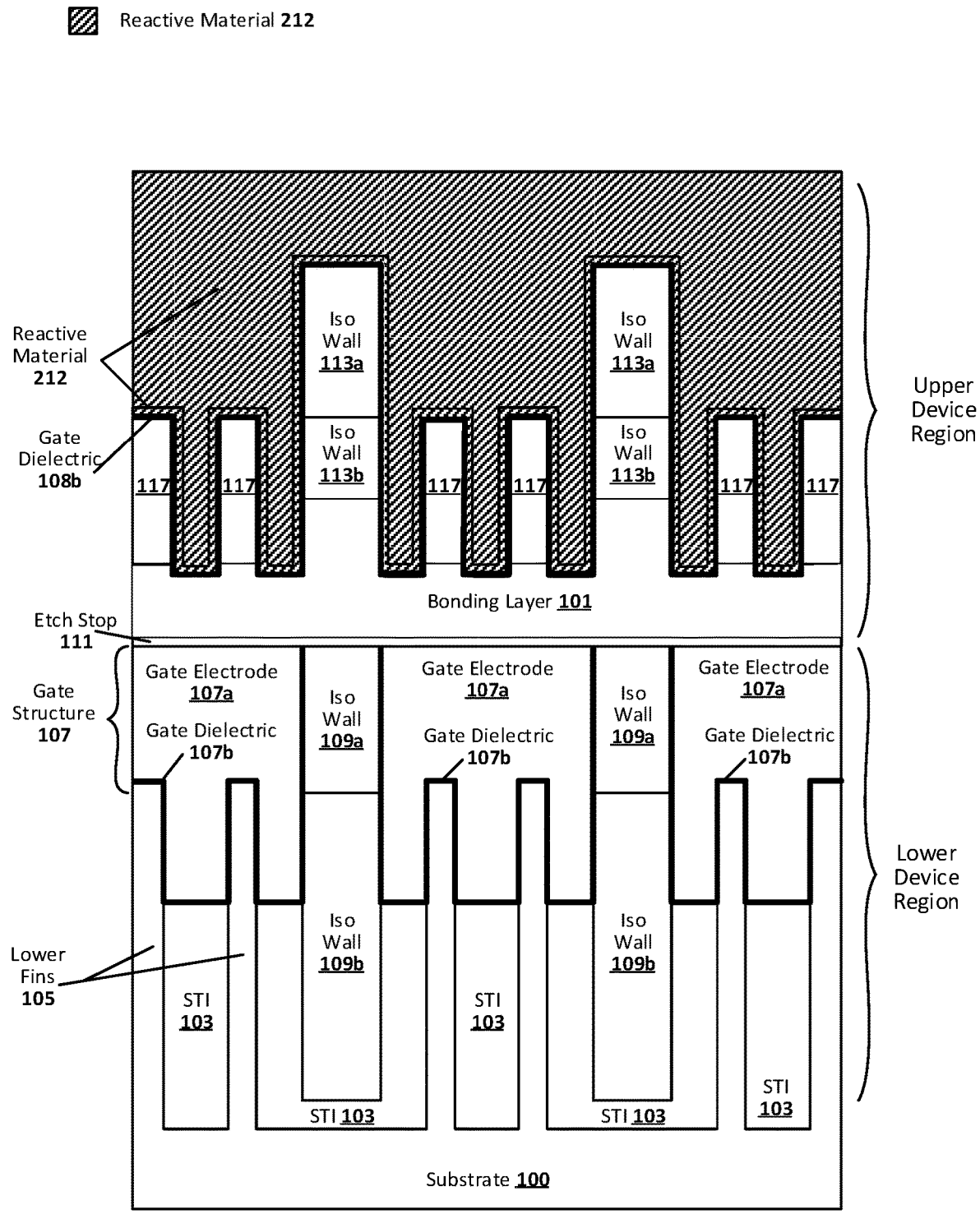
Figure 2E:
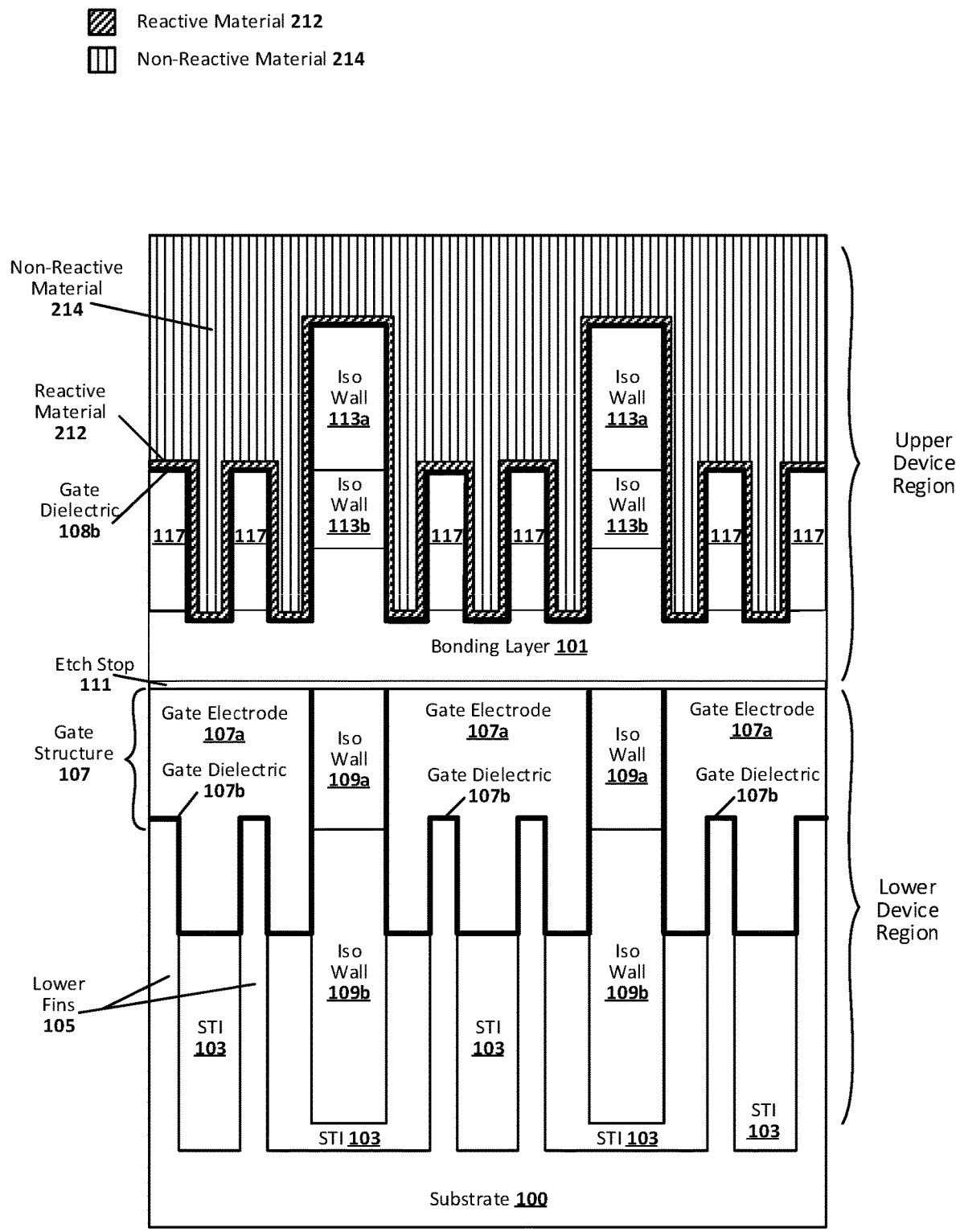
Figure 2F:
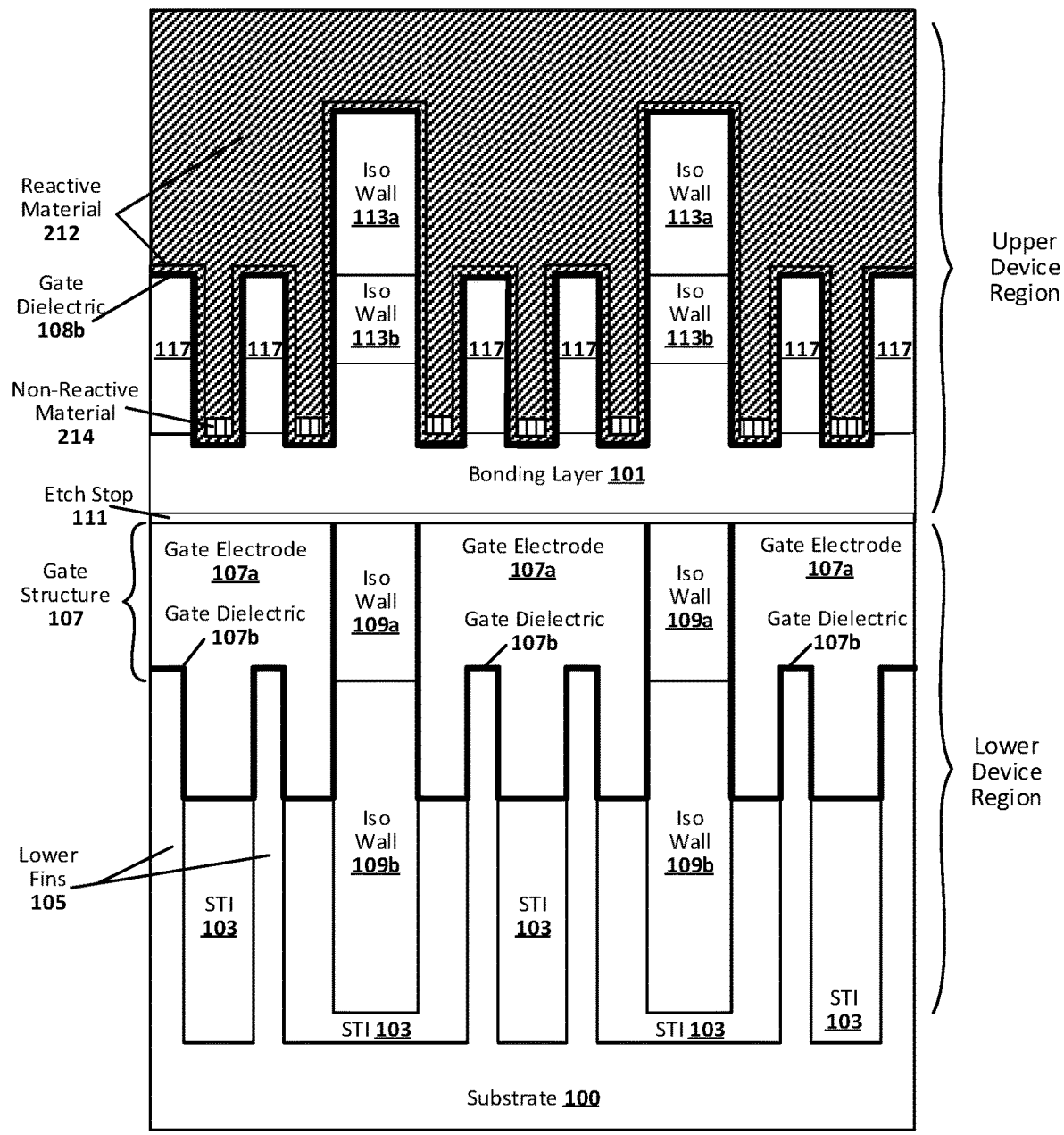

FIG. 2d shows the resulting structure after reactive material 212 has been provisioned. The previous relevant discussion with respect to example materials (e.g., silicon, germanium, germanium-rich SiGe, silicon-rich SiGe, and group III-V materials such as GaAs or GaN) is equally applicable here. As can be seen, the reactive material 212 can be deposited via ALD in a conformal or uniform manner as shown in the example embodiment of FIG. 2d (rather than as a fill material), but other embodiments may use other deposition processes (e.g., CVD, PECVD, PVD, MBE), including selective deposition rather than uniform. The thickness of reactive material 212 can vary, but in some embodiments is in the range of 1 nm to 10 nm (e.g., 2 nm to 5 nm). FIG. 2e shows the resulting structure after non-reactive material 214 has been provisioned over the reactive material 212. FIG. 2f shows the resulting structure after the non-reactive material 214 has been recessed so as to cover only (or substantially only, as there may be some trace amounts that remain elsewhere) the lowermost portion of the reactive material 214. The previous relevant discussion with respect to example non-reactive materials (e.g., hardmask material) is equally applicable here. In some embodiments, such as shown in FIG. 2e, the remaining void over conformal reactive material 212 is filled with non-reactive material 214, and the non-reactive material 214 is then recessed via a timed or controlled etch to leave a remnant at just the bottom of the reactive material 212. The height of the non-reactive material 214 remnant can vary, but in some embodiments is in the range of 2 nm to 20 nm (e.g., 4 nm to 8 nm). In a more general sense, the non-reactive material 214 effectively serves to determine which regions of the reactive material 212 are to be transformed into a protective layer, and the remnants can be sized accordingly.

The location of the non-reactive material 214 remnant can vary as well. For instance, in the embodiment shown in FIG. 2f, the remnant is laterally adjacent or otherwise straddles the interface between the fin 117 and the bonding layer 101. In other embodiments, the remnant of non-reactive material 214 may be completely above that interface, or just below that interface. Further note in the example embodiment shown in FIG. 2f that the gate dielectric 108b is directly between the reactive material 212 and the fin 117, and the reactive material 212 is directly between the non-reactive material 214 and the gate dielectric 108b (proximate the bottom of the fin trench). Numerous variations will be apparent. For instance, in other embodiments, the gate dielectric 108b may not be on the bonding layer 101, for instance, so in some such cases the reactive material 212 would be at least in some locations directly between the non-reactive material 214 and the bonding layer 101 (proximate the bottom of the fin trench). In other such cases where the fin or channel body extends directly from or is otherwise native to an underlying substrate, the reactive material 212 could be at least in some locations directly between the non-reactive material 214 and the substrate. In still other embodiment where the channel region is planar, the reactive material 212 could be at least in some locations directly between the non-reactive material 214 and substrate or other semiconductor body (e.g., where the vertical sides of that portion of the substrate or body is not gated).

Figure 2G:
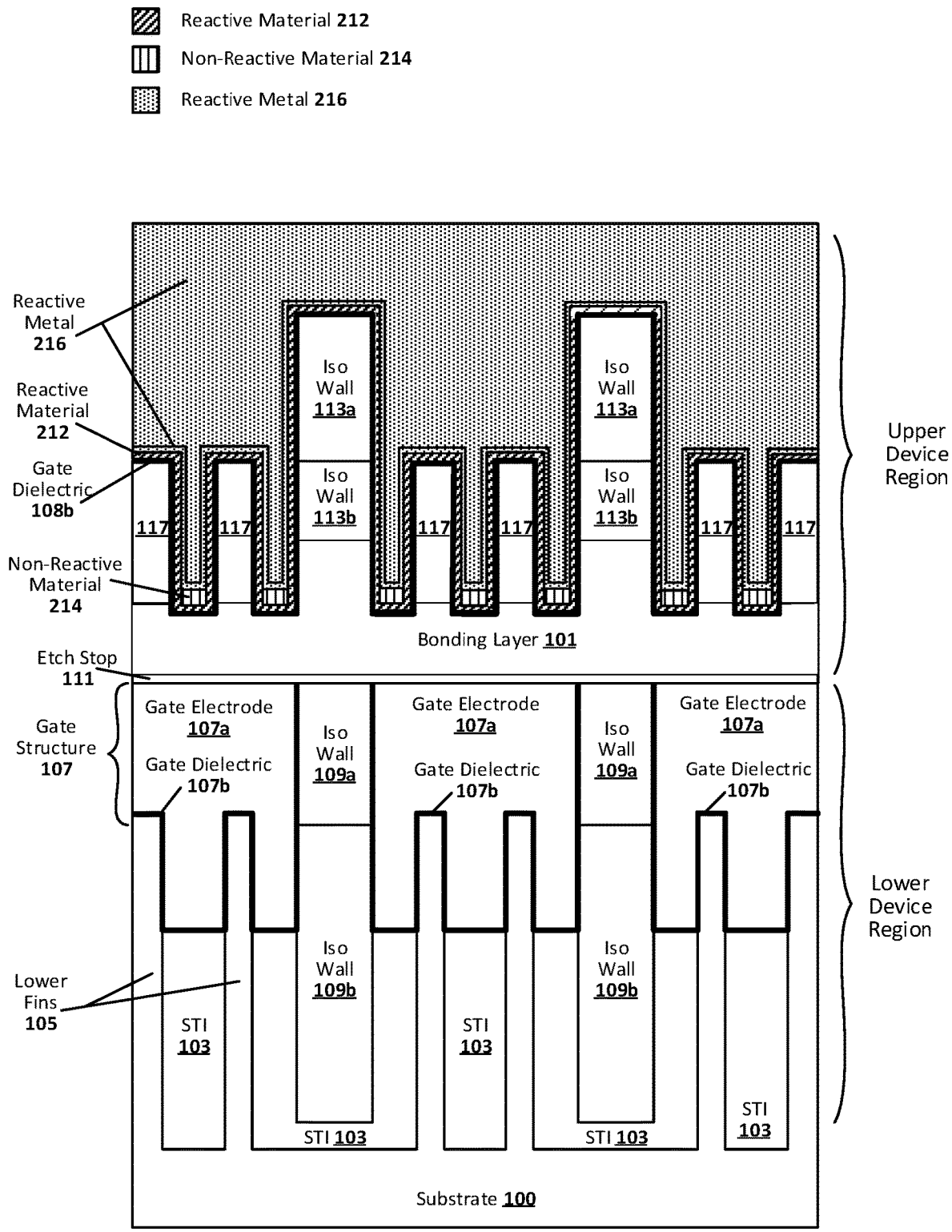
Figure 2H:
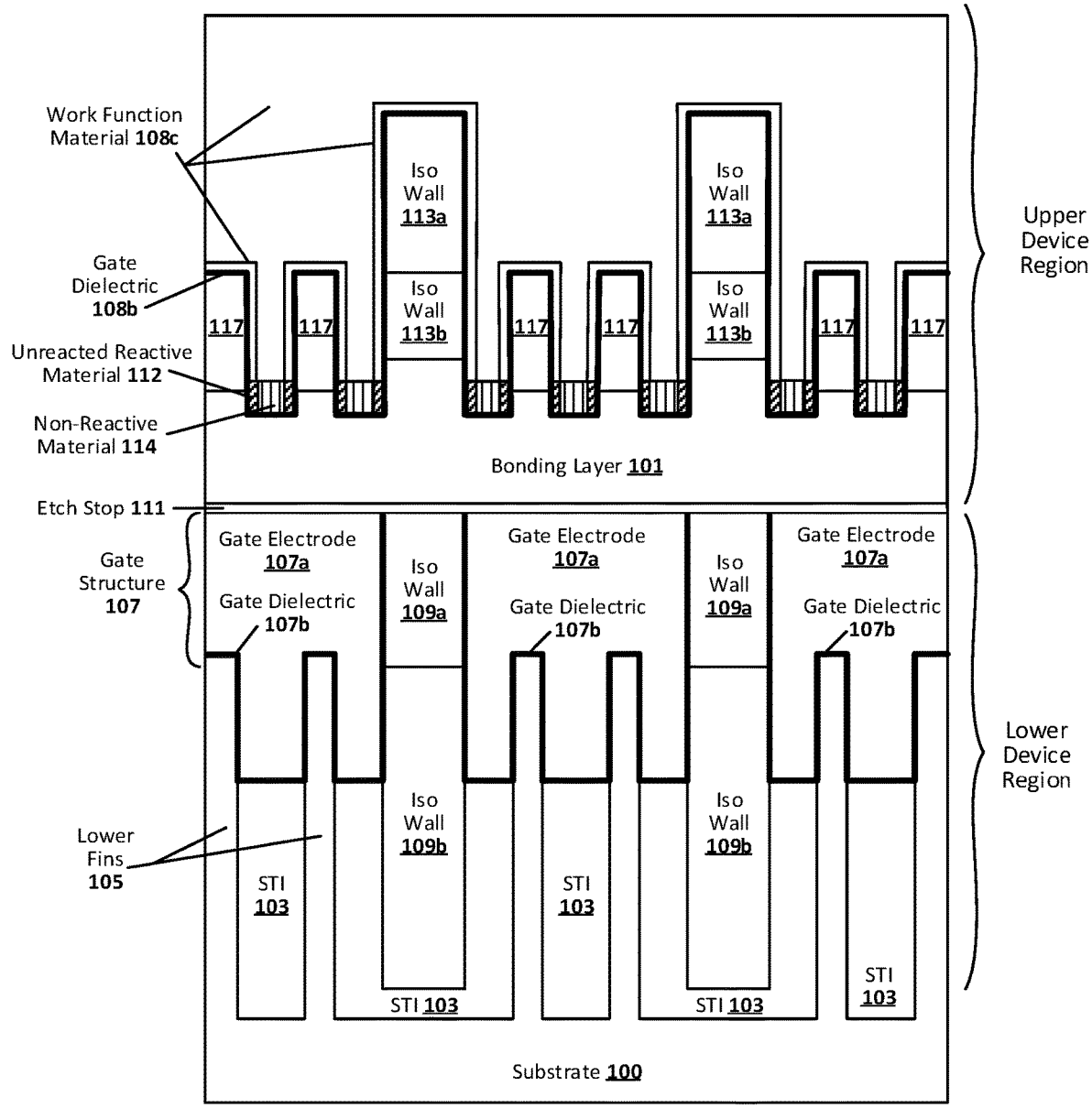

FIG. 2g shows the resulting structure after reactive metal 216 has been provisioned, and FIG. 2h shows the resulting structure after a thermal annealing process has been performed to cause the reactive semiconductor material 212 and the reactive metal 216 to react with one another thereby converting those layers into protective layer 108c which operates as work function material, according to an embodiment. In FIG. 2h, note how a portion of the reactive semiconductor material 212 that was masked by non-reactive material 114 remains after the annealing process, and is designated as unreacted reactive material 112 (as previously referenced with respect to FIG. 1). The previous relevant discussion with respect to example reactive metal materials (e.g., titanium, nickel, platinum, cobalt, aluminum, or an alloy thereof), as well as to example protective layers (e.g., silicides and germanides) resulting from the thermal annealing process, is equally applicable here. Many such material systems and protective layers can be used, as will be appreciated in light of this disclosure. The thickness of reactive metal 216 can vary, but in some embodiments tracks the thickness of the reactive semiconductor material 212 and is in the range of 1 nm to 10 nm (e.g., 2 nm to 5 nm). As will be further appreciated, the thickness of reactive metal 216 can be determined not only by thickness of reactive semiconductor material 212 but also by the desired phase of the reacted product created (e.g., the thicker the reactive metal 216 layer relative to reactive layer 212, the higher the desired metal content of the reacted resulting layer 208c). The reactive metal 216 can be deposited via ALD in a conformal or uniform manner as shown in the example embodiment of FIG. 2g, but in other embodiments other deposition processes (e.g., CVD, PECVD, PVD, MBE) can be used, including selective deposition rather than uniform. The thickness of the resulting reacted material (work function material 108c layer) can vary from one embodiment to the next, but in some cases is in the range of 1 nm to 15 nm (e.g., 2 nm to 6 nm, or 2 nm to 5 nm, or 4 nm to 8 nm, or 5 nm to 10 nm).

Figure 2I:
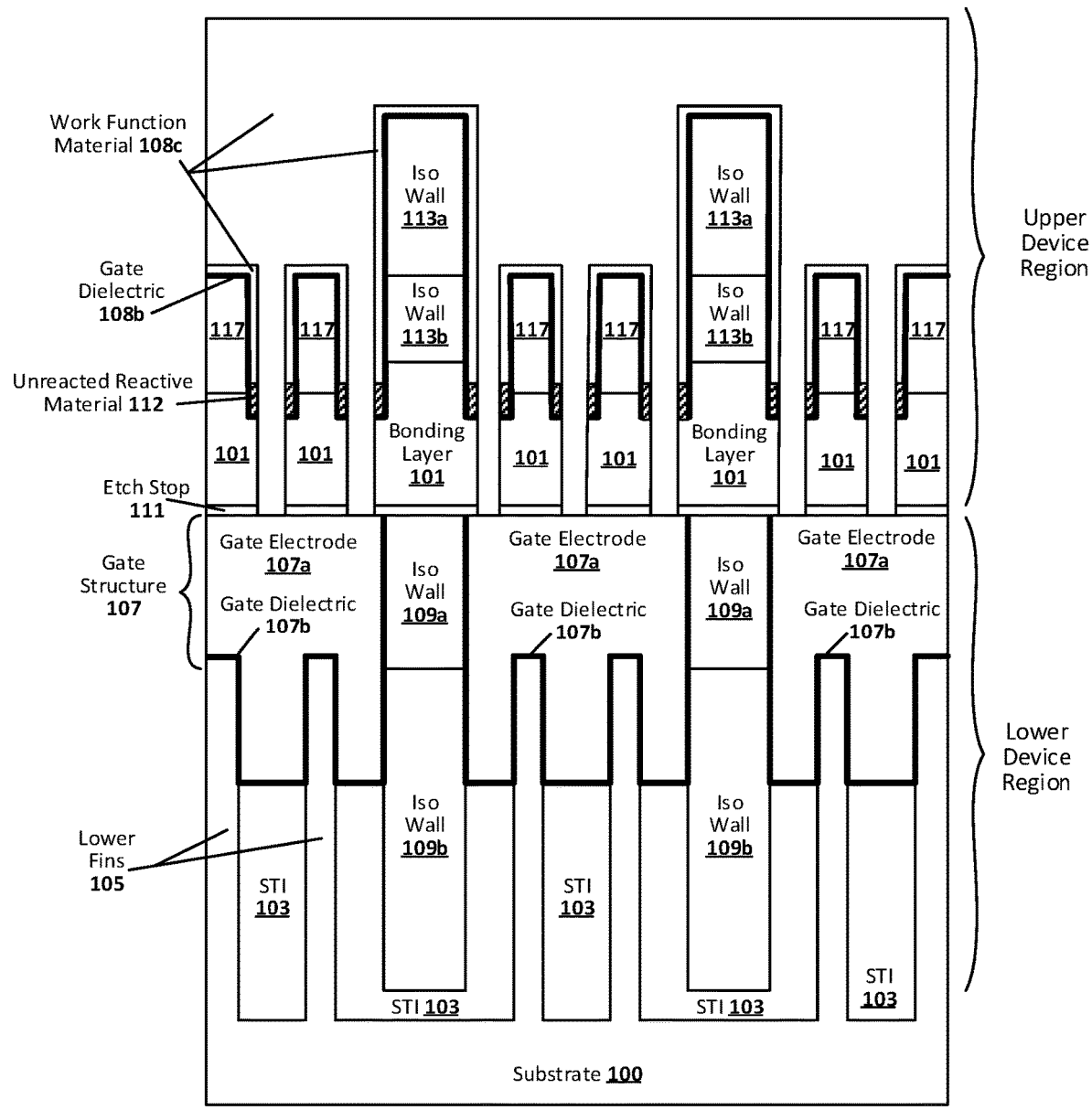

FIG. 2i shows the structure after a high aspect ratio etch is performed to remove the non-reactive material 114 between the remnants of unreacted reactive material 112, as well as the underlying portions of gate dielectric 108b (if present due to non-selective deposition), bonding layer 101, and etch stop layer 111, so as to expose top surfaces of the underlying gate electrodes 107a. As previously explained, the etch need not be perfectly vertical, but in some embodiments is an anisotropic etch so as to limit lateral etching. Other embodiments may include an acceptable degree is isotropic etch component. Note the chemistry and parameters of the etch can be varied as the etch progresses through the different materials, as will be appreciated.

Figure 2J:
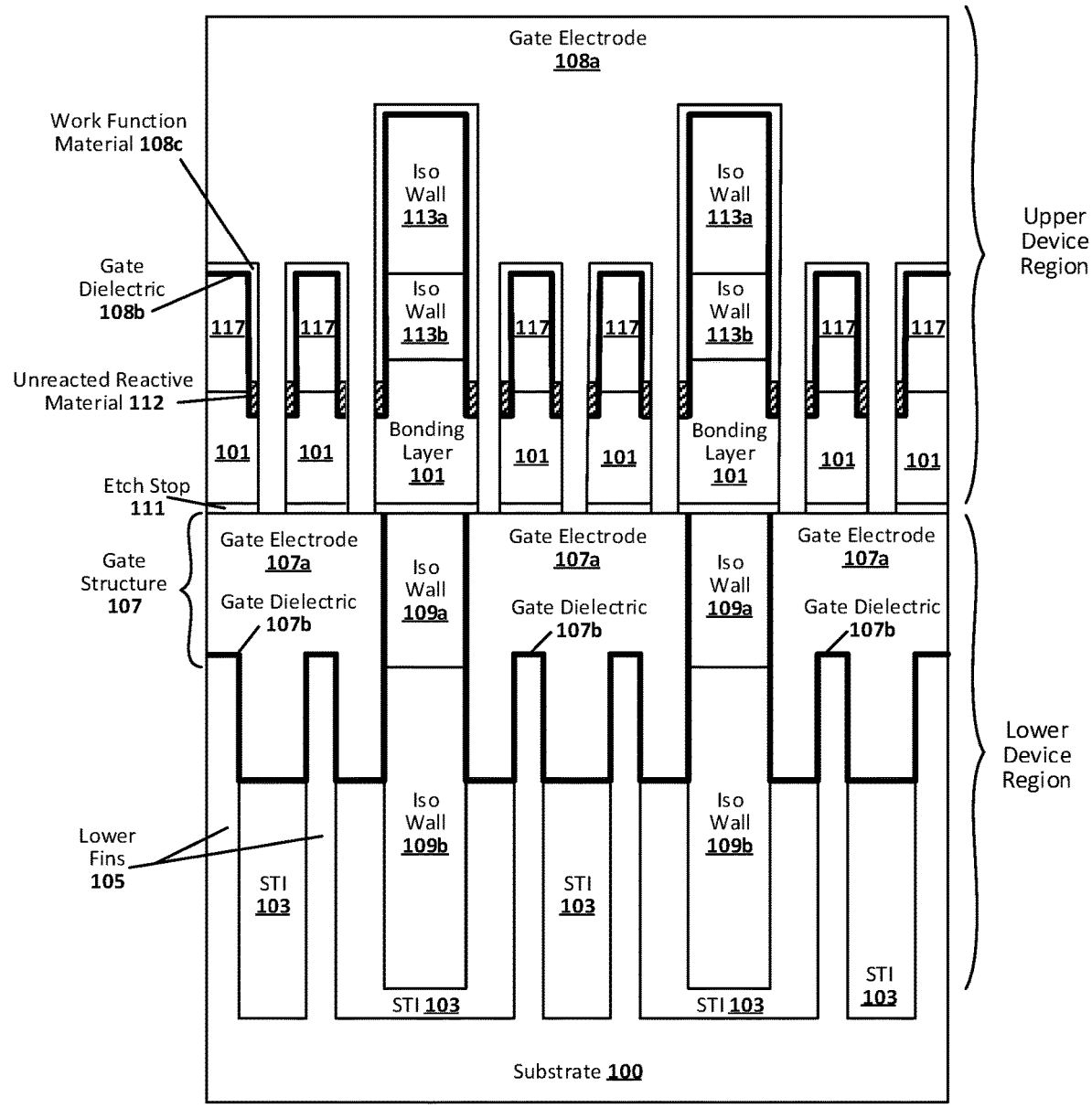

FIG. 2j shows the structure after the structure (including the void created by the etch) is filled with one or more conductors and/or metals to provide gate electrode 108a. The previous discussion with respect to example gate electrode materials and configurations is equally applicable here. As can be seen, the gate electrode 108a serves not only as the upper gate electrode but also provides an interconnect from the gate structure 108 of top device layer to the bottom gate structure 107. In some embodiments, any excess portion of gate electrode 108a can be planarized or otherwise removed, such as down to the tops of iso walls 113. In other embodiments, it may be desired to have one or more upper gate regions shorted together (so gate electrode 108a could be used to join those regions by extending over the intervening iso wall 113).

A number of observations regarding the example structure shown in FIG. 2j can be made. For instance, note that the unreacted reactive material 112 is collinear or otherwise self-aligned with the protective work function layer 108c, as are the underlying bonding layer 101 and etch top 123. This indicates, for instance, that the protective work function layer 108c was used to mask the bonding layer 101 to etchant used to form the interconnect, and further therefore indicates that this protective work function layer 108c was not deposited after the etch was completed. As will be appreciated, the size of the remnant (unreacted reactive material 112) can vary as well, but still may remain detectable in the final product, via various imaging and material analysis tools (e.g., transmission electron microscopy and material mapping). Further note that the unreacted reactive material 112 is directly between the interconnect (formed by gate electrode 108a) and the gate dielectric 108b. Further, and as previously explained, in other embodiments at least a portion of unreacted reactive material 112 may be directly between the interconnect (formed by gate electrode 108a) and the bonding layer 101 or alternatively a sub-channel or ungated semiconductor area of the upper device region. Further note the step-like shape of the bonding layer 101 that remains under the fin 117, due to the inset of the gate electrode 108b and the unreacted reactive material 112.

A further observation is that, while the cross-section shown in FIG. 2j is described as being through the channel region, in other embodiments it might be through the source/drain region. In such an example case, for instance, the semiconductor body 117 could be a source/drain region (e.g., heavily doped epi source/drain region), the gate dielectric 108b could be a resistance reducing layer or a liner or capping layer (e.g., such as a heavily doped germanium-rich capping layer or liner), work function layer 108c could be for tuning transistor performance (e.g., platinum germanide), and gate electrode 108a could be a source/drain contact structure (e.g., platinum, tungsten, cobalt, titanium, or aluminum plug, or an alloy of any of these). A similar alternative perspective applies to the lower device region cross-section of FIG. 2j. For instance, the top portion of semiconductor body 105 could be a source/drain region (e.g., heavily doped epi source/drain region or implantation-doped portion of fin), the gate dielectric 107b could be a resistance reducing layer or a liner or capping layer, and gate electrode 107a could be a source/drain contact structure, as will be appreciated.

Numerous variations and alternative configurations will be apparent in light of this disclosure. For instance, the example illustrated in FIG. 2j shows every vertical or downward pathway between the upper fins as having an interconnect for connecting to bottom gate electrodes. In other embodiments, only one or some of the top gate electrodes will be so connected. The devices to be paired can be selected via standard lithographic and masking operations, as will be further appreciated. Also, as previously stated, while the examples show fin structures for top and bottom devices, other embodiments may include any of fins, nanowires, nanoribbons, planar architectures, or any combination thereof. Also, all geometry may be rounded and corners may be blunted. For instance, the fins can be trapezoidal shaped, hourglass shaped, or another shape. Likewise, nanowires and nanoribbons can be similarly shaped, to some extent. Likewise, and as previously explained, the fins or nanostructures of the top layer need not be perfectly aligned with fins or nanostructures of the bottom layer, and there may be a different number or shape or geometry of fins on top and bottom. Also, the bottom device regions are shown fabricated on a bulk substrate. In other embodiments, the bottom device regions could be fabricated on a SOI or XOI substrate, for instance. Also, while work function layer 108c is described with respect to certain examples, such as titanium silicide and platinum germanide, the reactive materials and metals chosen to provide that protective layer 108c can be selected based upon any number of performance parameters, including but not limited to work function or threshold voltage needs of the transistor device. Furthermore, the selected reactive materials may differ, for example, with respect to whether the transistor is a PMOS or NMOS device.

Computing System

Figure 3:
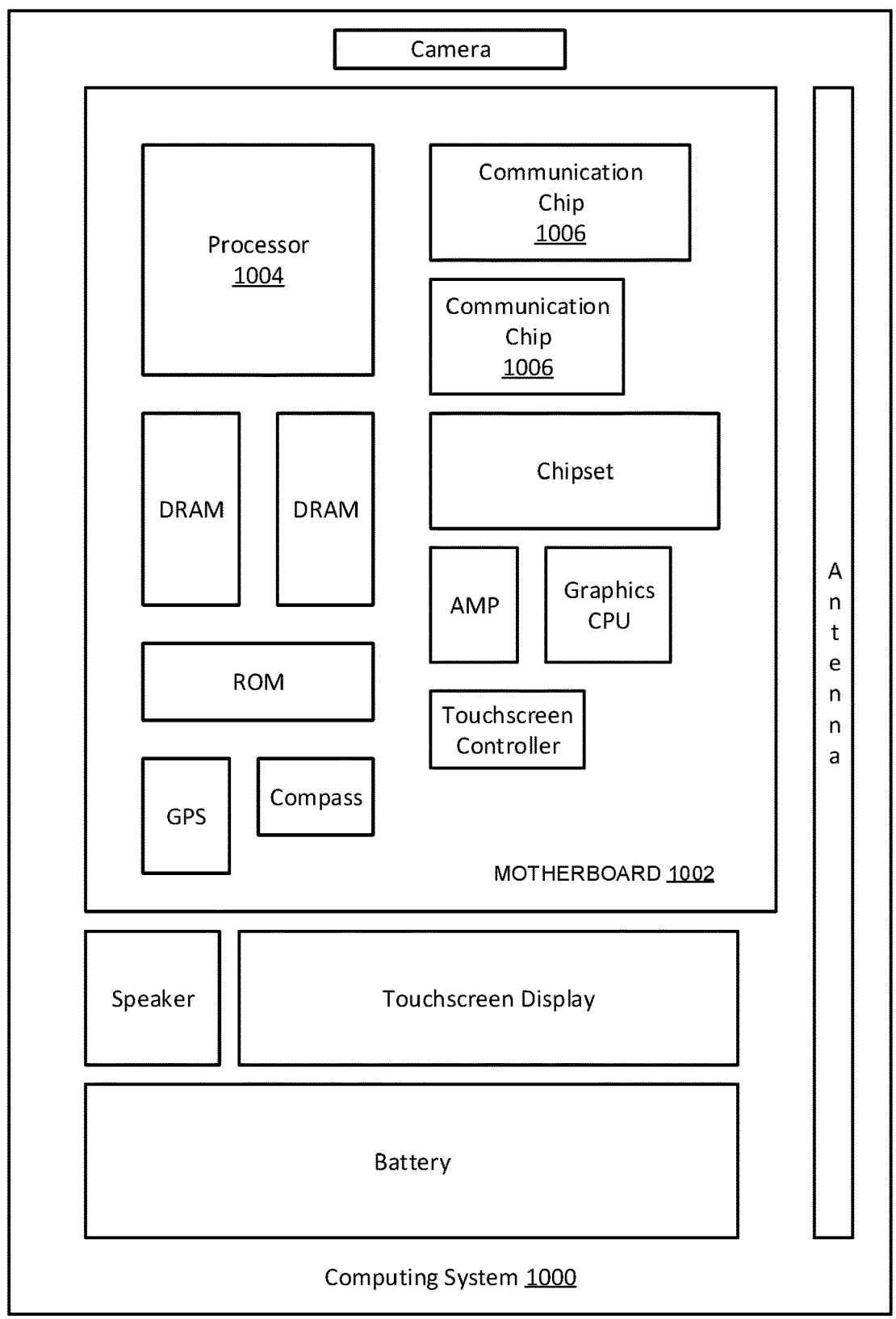
FIG. 3 illustrates a computing system implemented with one or more integrated circuit structures configured in accordance with an embodiment of the present disclosure.

FIG. 3 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuits configured with a stacked transistor structure having a stay-put protection layer that may provide additional benefits, as variously described herein. In some example embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some such example embodiments of the present disclosure, the integrated circuit die of the processor 1004 includes a vertically stacked transistor architecture having an interconnect and leave-behind protection layer scheme, as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more stacked transistor structures as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked transistor structures as variously provided herein. As will be appreciated in light of this disclosure, various embodiments of the present disclosure can be used to improve performance on products fabricated at any process node (e.g., in the micron range, or sub-micron and beyond), and further allow for the use of vertically stacked transistors having any number of source/drain configurations and channel configurations (e.g., Si, Ge, SiGe, multilayer structure of Si and SiGe, III-V such as gallium nitride or InGaAs, a semiconducting oxide such as nickel oxide or IGZO, and/or combinations thereof), wherein efficient protection layer and interconnect schemes are desired.

Further Example Embodiments

The following examples pertain to further embodiments, from which numerous permutations and configurations will be apparent.

Example 1 includes an integrated circuit, comprising: a first transistor device region including a first gate structure, the first gate structure including a gate electrode, a gate dielectric, and a layer, the layer between the gate electrode and gate dielectric and being compositionally different from the gate electrode and gate dielectric, and the layer including first and second portions, the first and second portions being collinear with each other and compositionally different from one another; and a second transistor device region including a contact structure, the contact structure being one of a second gate structure, a source contact, or a drain contact; wherein the first and second transistor device regions are arranged in a vertically stacked configuration, and a conductive interconnect extends downward from the gate electrode of the first gate structure to contact the contact structure.

Example 2 includes the subject matter of Example 1, wherein the first gate structure is part of a non-planar transistor that includes a body of semiconductor material, and the gate dielectric is on a top surface of the body and a sidewall surface of the body, such that the gate dielectric is directly between the sidewall surface and at least one of the first and second portions of the layer.

Example 3 includes the subject matter of Example 2, wherein the body is a fin.

Example 4 includes the subject matter of Example 2, wherein the body is a nanowire or a nanoribbon.

Example 5 includes the subject matter of any of Examples 2 through 4, wherein the gate dielectric is directly between the sidewall surface of the body and the first portion of the layer in a first location, and directly between the sidewall surface and the second portion of the layer in a second location.

Example 6 includes the subject matter of any of the preceding Examples, wherein the first gate structure is part of a planar transistor that includes a body of semiconductor material, and the gate dielectric is on a top surface of the body, such that the first and second portions of the layer are directly between the body and the conductive interconnect.

Example 7 includes the subject matter of any of the preceding Examples, wherein the gate dielectric comprises a high-k dielectric material.

Example 8 includes the subject matter of any of the preceding Examples, wherein the first gate structure is part of a transistor that includes a body of semiconductor material, the integrated circuit further comprising insulator material under the body, the insulator material having a sidewall that is collinear with the first and second portions of the layer.

Example 9 includes the subject matter of Example 8, wherein the insulator material is a bonding layer.

Example 10 includes the subject matter of any of the preceding Examples, wherein the first portion of the layer comprises a semiconductor and a metal, and the second portion comprises the semiconductor.

Example 11 includes the subject matter of Example 10, wherein the semiconductor is silicon and the metal is titanium.

Example 12 includes the subject matter of Example 10, wherein the semiconductor comprises one or more of silicon, germanium, or a group III-V material.

Example 11 includes the subject matter of Example 10 or 12, wherein the metal comprises one or more of titanium, nickel, platinum, cobalt, or aluminum.

Example 12 includes the subject matter of any of the preceding Examples, wherein the contact structure is a second gate structure.

Example 13 includes the subject matter of any of the preceding Examples, wherein the contact structure is a source contact or a drain contact.

Example 16 is an integrated circuit, comprising: a first transistor device region including a first source or drain contact structure on a semiconductor-containing source or drain region, the first source or drain contact structure including a metal body and a layer, the layer between the metal body and the semiconductor-containing source or drain region, the layer being compositionally different from the metal body and the semiconductor-containing source or drain region, and the layer including first and second portions, the first and second portions being collinear with each other and compositionally different from one another; a second transistor device region including a contact surface, the contact surface being part of a gate structure, or part of a second source or drain contact structure; wherein the first and second transistor device regions are arranged in a vertically stacked configuration, and a conductive interconnect extends downward from the first source or drain contact structure to contact the contact surface.

Example 17 includes the subject matter of Example 16, wherein the first source or drain contact structure is part of a non-planar transistor that includes a body of semiconductor material.

Example 18 includes the subject matter of Example 17, wherein the body is a fin.

Example 19 includes the subject matter of Example 17, wherein the body is a nanowire or a nanoribbon.

Example 20 includes the subject matter of any of Examples 16 through 19, wherein the first source or drain contact structure is part of a planar transistor that includes a body of semiconductor material.

Example 21 includes the subject matter of any of Examples 16 through 19, and further includes insulator material under the semiconductor-containing source or drain region, the insulator material having as sidewall that is collinear with the first and second portions of the layer.

Example 22 includes the subject matter of Example 21, wherein the insulator material is a bonding layer.

Example 23 includes the subject matter of any of Examples 16 through 22, wherein the first portion of the layer comprises a semiconductor and a metal, and the second portion comprises the semiconductor.

Example 24 includes the subject matter of Example 23, wherein the semiconductor is silicon and the metal is titanium.

Example 25 includes the subject matter of Example 23, wherein the semiconductor comprises one or more of silicon, germanium, or a group III-V material.

Example 26 includes the subject matter of Example 23 or 25, wherein the metal comprises one or more of titanium, nickel, platinum, cobalt, or aluminum.

Example 27 includes the subject matter of any of Examples 16 through 26, wherein the contact surface is part of a gate structure.

Example 28 includes the subject matter of any of Examples 16 through 26, wherein the contact surface is part of a second source or drain contact structure.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit, comprising:
   a first transistor device region including a first gate structure, the first gate structure including a gate electrode, a gate dielectric, and a layer, the layer between the gate electrode and gate dielectric and being compositionally different from the gate electrode and gate dielectric, and the layer including first and second portions, the first and second portions being collinear with each other and compositionally different from one another; and
   a second transistor device region including a contact structure, the contact structure being one of a second gate structure, a source contact, or a drain contact;
   wherein the first and second transistor device regions are arranged in a vertically stacked configuration, and a conductive interconnect extends downward from the gate electrode of the first gate structure to contact the contact structure.

2. The integrated circuit of claim 1, wherein the first gate structure is part of a non-planar transistor that includes a body of semiconductor material, and the gate dielectric is on a top surface of the body and a sidewall surface of the body, such that the gate dielectric is directly between the sidewall surface and at least one of the first and second portions of the layer.

3. The integrated circuit of claim 2, wherein the body is a fin.

4. The integrated circuit of claim 2, wherein the body is a nanowire or a nanoribbon.

5. The integrated circuit of claim 2, wherein the gate dielectric is directly between the sidewall surface of the body and the first portion of the layer in a first location, and directly between the sidewall surface and the second portion of the layer in a second location.

6. The integrated circuit of claim 1, wherein the first gate structure is part of a planar transistor that includes a body of semiconductor material, and the gate dielectric is on a top surface of the body, such that the first and second portions of the layer are directly between the body and the conductive interconnect.

7. The integrated circuit of claim 1, wherein the gate dielectric comprises a high-k dielectric material.

8. The integrated circuit of claim 1, wherein the first gate structure is part of a transistor that includes a body of semiconductor material, the integrated circuit further comprising insulator material under the body, the insulator material having a sidewall that is collinear with the first and second portions of the layer.

9. The integrated circuit of claim 1, wherein the first portion of the layer comprises a semiconductor and a metal, and the second portion comprises the semiconductor.

10. The integrated circuit of claim 9, wherein the semiconductor is silicon and the metal is titanium.

11. The integrated circuit of claim 9, wherein the semiconductor comprises one or more of silicon, germanium, or a group III-V material, and the metal comprises one or more of titanium, nickel, platinum, cobalt, or aluminum.

12. The integrated circuit of claim 1, wherein the contact structure is a second gate structure.

13. The integrated circuit of claim 1, wherein the contact structure is a source contact or a drain contact.

* * * * *